(12) United States Patent
Li et al.

(10) Patent No.: US 9,147,795 B2
(45) Date of Patent: *Sep. 29, 2015

(54) METHOD OF FORMING EMITTERS FOR A BACK-CONTACT SOLAR CELL

(71) Applicant: SunPower Corporation, San Jose, CA (US)

(72) Inventors: Bo Li, San Jose, CA (US); Peter J. Cousins, Los Altos, CA (US); David D. Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/555,383

(22) Filed: Nov. 26, 2014

(65) Prior Publication Data

US 2015/0087100 A1    Mar. 26, 2015

Related U.S. Application Data

(63) Continuation of application No. 14/302,256, filed on Jun. 11, 2014, now Pat. No. 8,912,038, which is a continuation of application No. 13/372,235, filed on Feb. 13, 2012, now Pat. No. 8,802,486.

(60) Provisional application No. 61/478,804, filed on Apr. 25, 2011.

(51) Int. Cl.
   *H01L 31/18*  (2006.01)
   *H01L 31/068*  (2012.01)
   *H01L 31/0224*  (2006.01)

(52) U.S. Cl.
   CPC .... *H01L 31/1864* (2013.01); *H01L 31/022441* (2013.01); *H01L 31/0682* (2013.01); *H01L 31/18* (2013.01); *H01L 31/1804* (2013.01); *Y02E 10/547* (2013.01)

(58) Field of Classification Search
   CPC .. H01L 31/0682; H01L 31/1804; Y02E 10/50
   USPC .................................................. 438/558, 567
   See application file for complete search history.

(56) References Cited

U.S. PATENT DOCUMENTS

| | | | | |
|---|---|---|---|---|
| 7,279,832 B2 * | 10/2007 | Thurk et al. | ................. | 313/503 |
| 7,521,340 B2 * | 4/2009 | Lemmi et al. | ................. | 438/479 |
| 7,572,740 B2 * | 8/2009 | Terry et al. | ................. | 438/752 |
| 7,615,393 B1 * | 11/2009 | Shah et al. | ................. | 438/48 |
| 7,704,866 B2 * | 4/2010 | Vanheusden et al. | ......... | 438/533 |
| 7,705,237 B2 * | 4/2010 | Swanson | ................. | 136/261 |
| 7,718,707 B2 * | 5/2010 | Kelman et al. | ................. | 516/1 |
| 7,727,901 B2 * | 6/2010 | Rogojina et al. | ............. | 438/752 |

(Continued)

OTHER PUBLICATIONS

Extended European Search Report from EP 12776847.1 mailed Aug. 21, 2014, 8 pgs.

(Continued)

*Primary Examiner* — Earl Taylor
(74) *Attorney, Agent, or Firm* — Blakely Sokoloff Taylor Zafman LLP

(57) ABSTRACT

Methods of forming emitters for back-contact solar cells are described. In one embodiment, a method includes forming a first solid-state dopant source above a substrate. The first solid-state dopant source includes a plurality of regions separated by gaps. Regions of a second solid-state dopant source are formed above the substrate by printing.

20 Claims, 7 Drawing Sheets

(56) References Cited

U.S. PATENT DOCUMENTS

| | | | |
|---|---|---|---|
| 7,812,250 B2* | 10/2010 | Smith | 136/255 |
| 7,820,475 B2* | 10/2010 | De Ceuster et al. | 438/98 |
| 7,851,698 B2* | 12/2010 | De Ceuster et al. | 136/255 |
| 8,163,638 B2* | 4/2012 | De Ceuster et al. | 438/558 |
| 8,492,253 B2* | 7/2013 | Manning | 438/563 |
| 8,802,486 B2* | 8/2014 | Li et al. | 438/98 |
| 8,912,038 B2* | 12/2014 | Li et al. | 438/98 |
| 2004/0245912 A1* | 12/2004 | Thurk et al. | 313/484 |
| 2004/0252488 A1* | 12/2004 | Thurk | 362/147 |
| 2006/0030109 A1* | 2/2006 | Ranade et al. | 438/283 |
| 2006/0034065 A1* | 2/2006 | Thurk | 362/84 |
| 2006/0162766 A1* | 7/2006 | Gee et al. | 136/256 |
| 2007/0151598 A1* | 7/2007 | De Ceuster et al. | 136/256 |
| 2008/0248307 A1* | 10/2008 | Jurbergs et al. | 428/405 |
| 2009/0092745 A1* | 4/2009 | Pavani et al. | 427/74 |
| 2009/0205712 A1* | 8/2009 | Cousins | 136/261 |
| 2009/0269913 A1* | 10/2009 | Terry et al. | 438/558 |
| 2009/0308438 A1 | 12/2009 | De Ceuster | |
| 2010/0055822 A1* | 3/2010 | Weidman et al. | 438/57 |
| 2010/0139764 A1* | 6/2010 | Smith | 136/256 |
| 2010/0167510 A1* | 7/2010 | Kelman et al. | 438/544 |
| 2011/0000540 A1* | 1/2011 | De Ceuster et al. | 136/256 |
| 2011/0003423 A1* | 1/2011 | Smith | 438/71 |
| 2011/0003424 A1* | 1/2011 | De Ceuster et al. | 438/71 |
| 2011/0059571 A1* | 3/2011 | De Ceuster et al. | 438/71 |

OTHER PUBLICATIONS

International Preliminary Report on Patentability from PCT/US2012/025264 mailed Nov. 7, 2013, 6 pgs.

International Search Report and Written Opinion from PCT/US2012/025264 mailed Sep. 19, 2012, 10 pgs.

* cited by examiner

METHOD OF FORMING EMITTERS FOR A BACK-CONTACT SOLAR CELL

CROSS-REFERENCE TO RELATED APPLICATIONS

This application is a continuation of U.S. patent application Ser. No. 14/302,256, filed on Jun. 11, 2014, which is a continuation of U.S. patent application Ser. No. 13/372,235, filed on Feb. 13, 2012, now U.S. Pat. No. 8,802,486, issued on Aug. 12, 2014, which claims the benefit of U.S. Provisional Application No. 61/478,804, filed Apr. 25, 2011, the entire contents of which are hereby incorporated by reference herein.

STATEMENT OF GOVERNMENT LICENSE RIGHTS

The invention described herein was made with governmental support under contract number DE-FC36-07GO17043 awarded by the United States Department of Energy. The United States Government may have certain rights in the invention.

TECHNICAL FIELD

Embodiments of the present invention are in the field of renewable energy and, in particular, methods of forming emitters for back-contact solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

Figure 1:
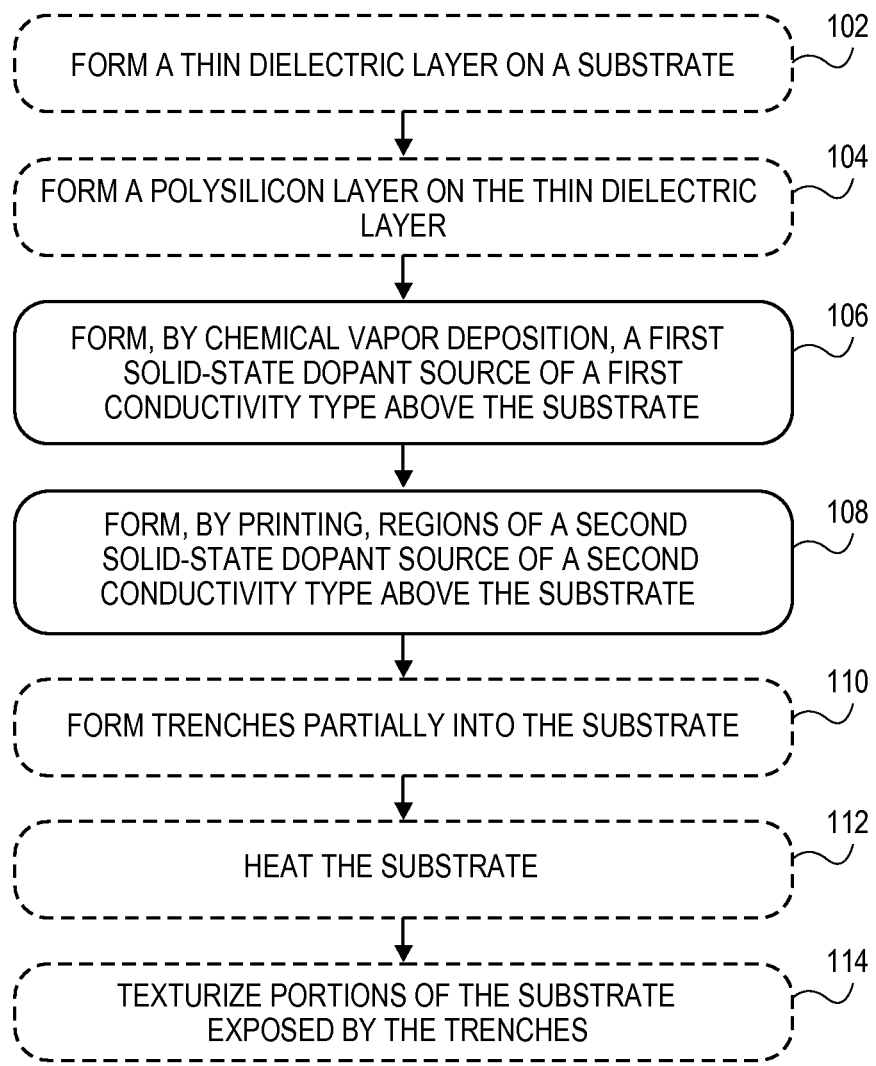
FIG. 1 illustrates a flowchart representing operations in a method of forming emitters for a back-contact solar cell, in accordance with an embodiment of the present invention.

Methods of forming emitters for back-contact solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithography and patterning techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of forming emitters for back-contact solar cells. In one embodiment, a method includes forming, by chemical vapor deposition, a first solid-state dopant source of a first conductivity type above a substrate. The first solid-state dopant source includes a plurality of regions separated by gaps. Regions of a second solid-state dopant source of a second conductivity type are formed above the substrate by printing. The regions of the second solid-state dopant source are formed in the gaps of the plurality of regions of the first solid-state dopant source but not in contact with the plurality of regions of the first solid-state dopant source. The first conductivity type is opposite the second conductivity type.

In another embodiment, a method includes forming, by printing, a first solid-state dopant source of a first conductivity type above a substrate. The first solid-state dopant source includes a plurality of regions separated by gaps. A second solid-state dopant source of a second conductivity type is formed above the first solid-state dopant source by chemical vapor deposition. The second solid-state dopant source is also formed above the substrate, in the gaps of the plurality of regions of the first solid-state dopant source. The first conductivity type is opposite the second conductivity type. The second solid-state dopant source is then patterned to form first regions of the second solid-state dopant source in the gaps of the plurality of regions of the first solid-state dopant source but not in contact with the plurality of regions of the first solid-state dopant source. Second regions of the second solid-state dopant source remain on the plurality of regions of the first solid-state dopant source. The first solid-state dopant source is sufficiently thick to block driving of dopants from the second regions of the second solid-state dopant source through the plurality of regions of the first solid-state dopant source.

Emitters for back-contact solar cells may be formed by patterning through blanket-deposited doped films. This approach typically involves deposition of a blanket dopant-containing film, deposition of a sacrificial etch resist, etching of the dopant-containing film, and stripping of the etch resist. These multiple process operations increase the manufacturing complexity and cost for solar cell production. Since numerous operations are used, yield may also be reduced.

In accordance with an embodiment of the present invention, a total number of process operations used for doping back-contact solar cells is reduced by using methods described herein. As such, one or more of the embodiments of methods described herein may simplify emitter formation. In at least some embodiments, such improvements are achieved through selective dopant deposition which combines dopant deposition and patterning in single operation.

In a specific exemplary embodiment, a conventional process having four operations in a portion of a manufacturing flow is reduced to two operations for that portion of the flow. A particular example includes replacing the operations: depositing first solid-state dopant source, masking, etching, and then depositing second solid-state dopant source, with the operations: ink jetting first solid-state dopant source and then depositing second solid-state dopant source. In another specific exemplary embodiment, a conventional process having six operations in a portion of a manufacturing flow is reduced to five operations for that portion of the flow. A particular example includes replacing the operations: depositing first solid-state dopant source, masking, etching, depositing second solid-state dopant source, masking, and then etching, with the operations: depositing first solid-state dopant source, masking, etching, ink jetting second solid-state dopant source, and then curing, or with the operations: ink jetting first solid-state dopant source, depositing second solid-state dopant source, curing, masking, and then etching. Examples of printable dopant sources include ink-jet printable dopant source materials including, but not limited to, spin on glass-based materials or nanoparticle-based materials.

Following formation of doped regions in semiconductor layers or substrates by approaches described herein, the formation of contacts for a back-contact solar cell may be performed using laser ablation to form holes or openings through an anti-reflective coating (ARC) layer formed above an array of p-type and n-type doped regions on the back-side of the solar cell. Conductive contacts, such as metal contacts, may then be formed in the openings to provide electrical coupling with the array of p-type and n-type doped regions.

In an aspect of the present invention, a second conductivity-type solid-state dopant source is printed between features of an already patterned first conductivity-type solid-state dopant source. For example, FIG. 1 illustrates a flowchart 100 representing operations in a method of forming emitters for a back-contact solar cell, in accordance with an embodiment of the present invention. FIGS. 2A-2I illustrate cross-sectional views of various stages in the fabrication of a back-contact solar cell, corresponding to operations of flowchart 100, in accordance with an embodiment of the present invention.

Figure 2A:
FIG. 2A illustrates a cross-sectional view of a stage in the fabrication of a back-contact solar cell, corresponding to operation 102 of the flowchart of FIG. 1 and to operation 302 of the flowchart of FIG. 3, in accordance with an embodiment of the present invention.

Referring to operation 102 of flowchart 100, and to corresponding FIG. 2A, a method of forming emitters for a back-contact solar cell includes optionally forming a thin dielectric layer 202 on a substrate 200.

In an embodiment, the thin dielectric layer 202 is composed of silicon dioxide and has a thickness approximately in the range of 5-50 Angstroms. In one embodiment, the thin dielectric layer 202 performs as a tunneling oxide layer. In an embodiment, substrate 200 is a bulk single-crystal substrate, such as an n-type doped single crystalline silicon substrate. However, in an alternative embodiment, substrate 200 includes a polycrystalline silicon layer disposed on a global solar cell substrate.

Figure 2B:
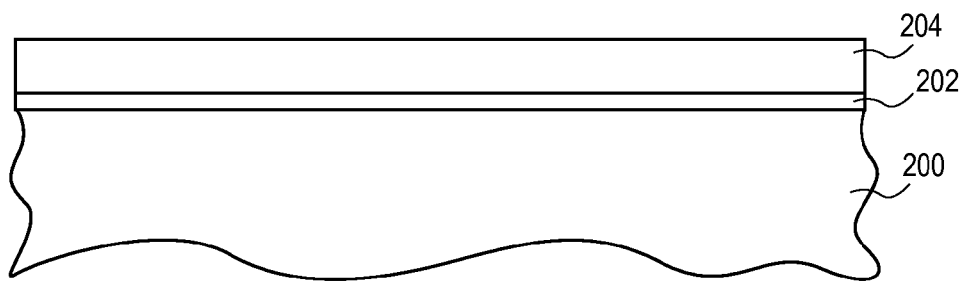
FIG. 2B illustrates a cross-sectional view of a stage in the fabrication of a back-contact solar cell, corresponding to operation 104 of the flowchart of FIG. 1 and to operation 304 of the flowchart of FIG. 3, in accordance with an embodiment of the present invention.

Referring to operation 104 of flowchart 100, and to corresponding FIG. 2B, the method of forming emitters for the back-contact solar cell also includes optionally forming a polysilicon layer 204 on the thin dielectric layer 202. It is to be understood that use of the term polysilicon layer is intended to also cover material that can be described as amorphous- or α-silicon.

Figure 2C:
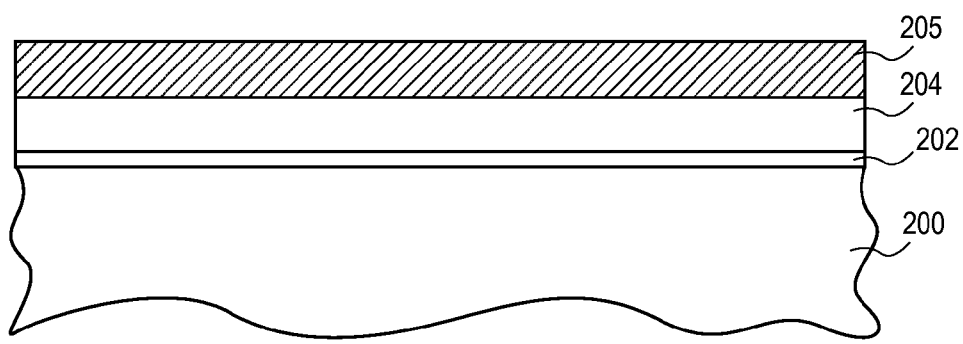
FIG. 2C illustrates a cross-sectional view of a stage in the fabrication of a back-contact solar cell, corresponding to operation 106 of the flowchart of FIG. 1, in accordance with an embodiment of the present invention.
Figure 2D:
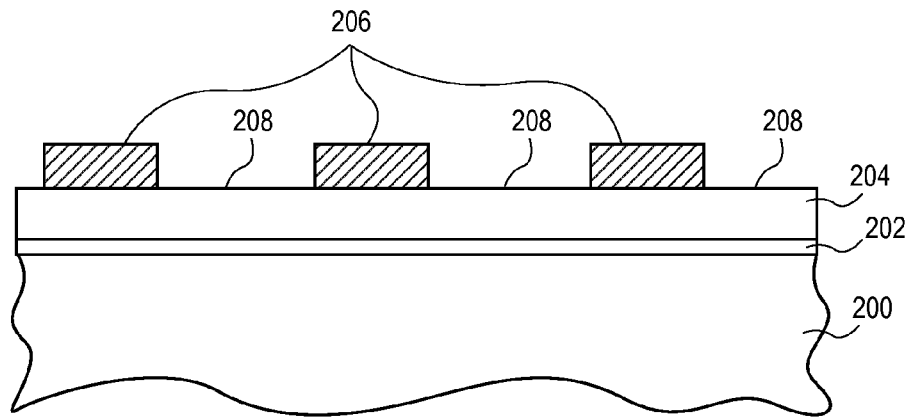
FIG. 2D illustrates a cross-sectional view of a stage in the fabrication of a back-contact solar cell, also corresponding to operation 106 of the flowchart of FIG. 1, in accordance with an embodiment of the present invention.

Referring to operation 106 of flowchart 100, and to corresponding FIG. 2C and 2D, the method of forming emitters for the back-contact solar cell includes forming (layer 205 of FIG. 2C) and patterning a first solid-state dopant source 206 of a first conductivity type on the polysilicon layer 204.

In an embodiment, the patterning forms gaps 208 exposing regions of the polysilicon layer 204 between a plurality of regions of the first solid-state dopant source 206, as depicted in FIG. 2D. In one embodiment, forming and patterning the first solid-state dopant source 206 includes forming and patterning a layer of boron silicate glass (BSG) or a layer of phosphorus silicate glass (PSG). In a specific embodiment, the BSG or PSG layer is formed by chemical vapor deposition as a uniform, blanket layer and then patterned by a lithography and etch process. In a particular such embodiment, the BSG or PSG layer is formed by a chemical vapor deposition technique such as, but not limited to, atmospheric pressure chemical vapor deposition (APCVD), plasma-enhanced chemical vapor deposition (PECVD), low-pressure chemical vapor deposition (LPCVD), or ultra-high vacuum chemical vapor deposition (UHVCVD). In an alternative specific embodiment, the BSG or PSG layer is deposited already having a pattern and, thus, the forming and patterning are performed simultaneously. In one such embodiment, the patterned BSG or PSG layer is formed by a screen-printing approach. It is to be understood that a solid-state dopant source is a layer of film that includes dopant impurity atoms and can be deposited above a substrate. This is in contrast to an ion implantation approach.

Figure 2E:
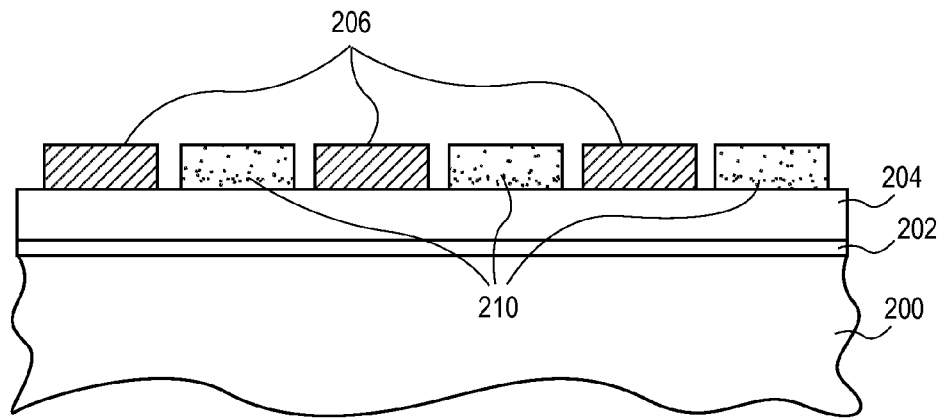
FIG. 2E illustrates a cross-sectional view of a stage in the fabrication of a back-contact solar cell, corresponding to operation 108 of the flowchart of FIG. 1, in accordance with an embodiment of the present invention.

Referring to operation 108 of flowchart 100, and to corresponding FIG. 2E, the method of forming emitters for the back-contact solar cell also includes forming, by printing, regions of a second solid-state dopant source 210 of a second conductivity type above the substrate 200. In an embodiment, the printing is performed by a technique such as, but not limited to, ink jet printing, screen printing, or aerosol printing.

In an embodiment, the regions of the second solid-state dopant source 210 are formed in the gaps 208 of the plurality of regions of the first solid-state dopant source 206 but not in contact with the plurality of regions of the first solid-state dopant source 206, as depicted in FIG. 2E. And, in a more specific embodiment, the regions of the second solid-state dopant source 210 are spaced apart from the plurality of regions of the first solid-state dopant source 206, as is also depicted in FIG. 2E. In an embodiment, the first solid-state dopant source 205/206 and the second solid-state dopant source 210 are formed on the polysilicon layer 204. However, there may be applications where a polysilicon layer distinct from a substrate is not used. Thus, in another embodiment (not shown), the first solid-state dopant source 205/206 and the second solid-state dopant source 210 are formed directly on a substrate (such as directly on substrate 200) or on a thin oxide layer on the surface of the substrate.

In an embodiment, the second solid-state dopant source 210 is composed of a material such as, but not limited to, a spin-on-glass precursor material or a nanoparticle material. The spin-on-glass precursor material or the nanoparticle material includes dopants of the second conductivity type disposed therein. For example, in one embodiment, the second conductivity type is n-type and the dopant impurity atoms are phosphorus atoms. In one embodiment, the second conductivity type is p-type and the dopant impurity atoms are boron atoms.

In an embodiment, the first conductivity type is opposite the second conductivity type. For example, in one embodiment, the first conductivity type is p-type, the second conductivity type is n-type, and the first solid-state dopant source 205/206 is composed of BSG. In another embodiment, the first conductivity type is n-type, the second conductivity type is p-type, and the first solid-state dopant source 205/206 is composed of PSG.

Figure 2F:
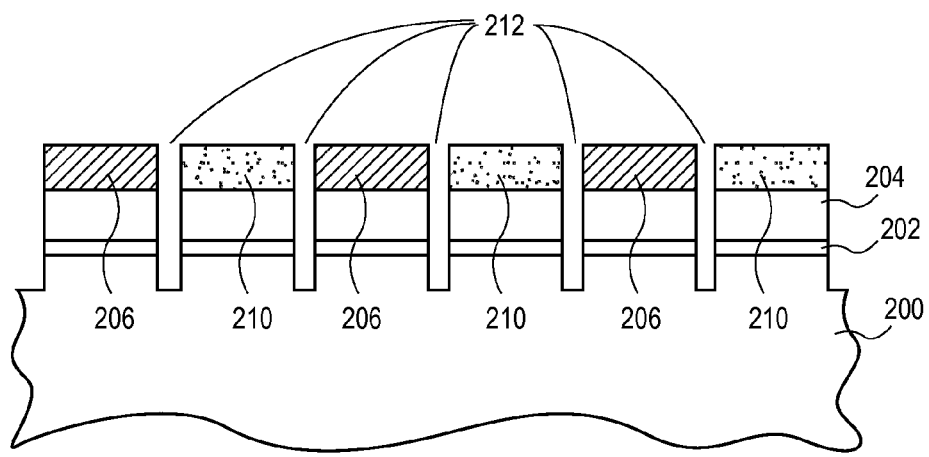
FIG. 2F illustrates a cross-sectional view of a stage in the fabrication of a back-contact solar cell, corresponding to operation 110 of the flowchart of FIG. 1, in accordance with an embodiment of the present invention.

Referring to operation 110 of flowchart 100, and to corresponding FIG. 2F, in one embodiment the method of forming emitters for the back-contact solar cell optionally further includes forming trenches 212 partially into the substrate 200, between the regions of the second solid-state dopant source 210 and the plurality of regions of the first solid-state dopant source 206. In an embodiment, the trenches 212 are formed in the polysilicon layer 204, in the thin dielectric layer 202, and partially in the substrate 200, as depicted in FIG. 2F.

Figure 2G:
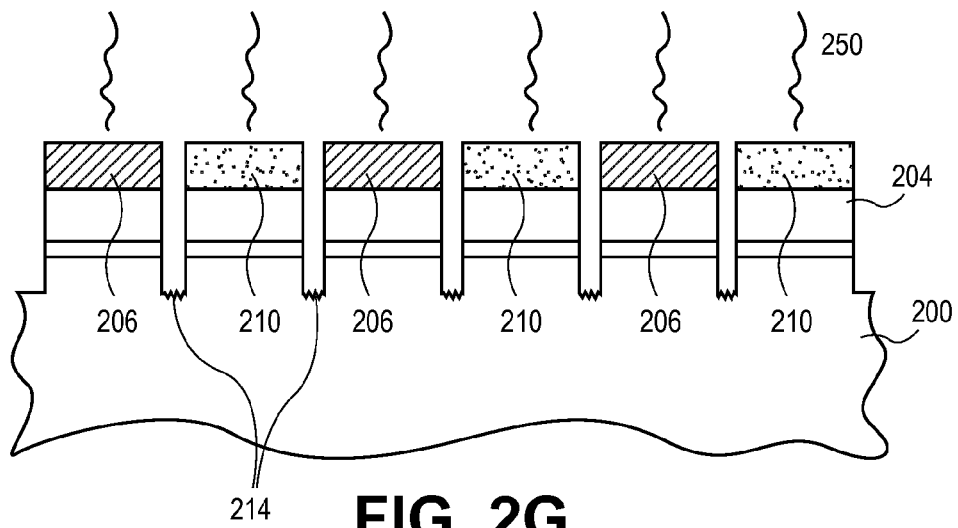
FIG. 2G illustrates a cross-sectional view of a stage in the fabrication of a back-contact solar cell, corresponding to operations 112 and 114 of the flowchart of FIG. 1, in accordance with an embodiment of the present invention.

Referring to operation 112 of flowchart 100, and to corresponding FIG. 2G, in one embodiment the method of forming emitters for the back-contact solar cell optionally further includes, subsequent to forming the trenches 212, heating 250 the substrate 200.

In an embodiment, the heating drives dopants from the first and second solid-state dopant sources 206 and 210. For example, in one embodiment, the first and second solid-state dopant sources 206 and 210 are formed on the polysilicon layer 204 and heating the substrate 200 drives dopants from the first and second solid-state dopant sources 206 and 210, respectively, into the polysilicon layer 204. However, in another embodiment, the first and second solid-state dopant sources 206 and 210 are formed directly on substrate 2090 or on a thin oxide on substrate 200, and heating the substrate 200 drives dopants from the first and second solid-state dopant sources 206 and 210, respectively, into the substrate 200. In one specific such embodiment, the substrate 200 is a bulk crystalline silicon substrate, and the first solid-state dopant source 206 and the second solid-state dopant source 210 are formed on the bulk crystalline silicon substrate. The bulk crystalline silicon substrate is then heated to drive dopants from the first and second solid-state dopant sources 206 and 210 into the bulk crystalline silicon substrate.

Referring to operation 114 of flowchart 100, and again to corresponding FIG. 2G, in one embodiment the method of forming emitters for the back-contact solar cell optionally further includes, texturizing portions 214 of the substrate 200 exposed by the trenches 212.

In an embodiment, the texturing provides a random texture pattern. The random texturing pattern may be formed by applying an anisotropic etching process to exposed regions of substrate 200 and may thus be determined by crystal planes, such single-crystalline silicon planes, of the substrate 200. In an embodiment, the heating of operation 112 hardens the second solid-state dopant source 210. Then, during the texturizing of the portions 214 of the substrate 200 exposed by the trenches 212, the hardened second solid-state dopant source acts as a mask.

For example, in a specific embodiment, the hardened second solid-state dopant source acts as a mask to provide selectivity to hydroxide (OH$^-$) based etching. That is, inherent in the doping process using the printed solid-state dopant source is an ability to provide a mask for texturizing operations. It is to be understood that other doping approaches, such as atmospheric pressure chemical vapor deposition (APCVD), implantation, or laser doping, may not provide routes for such masking that are inherent in the doping process.

Figure 2H:
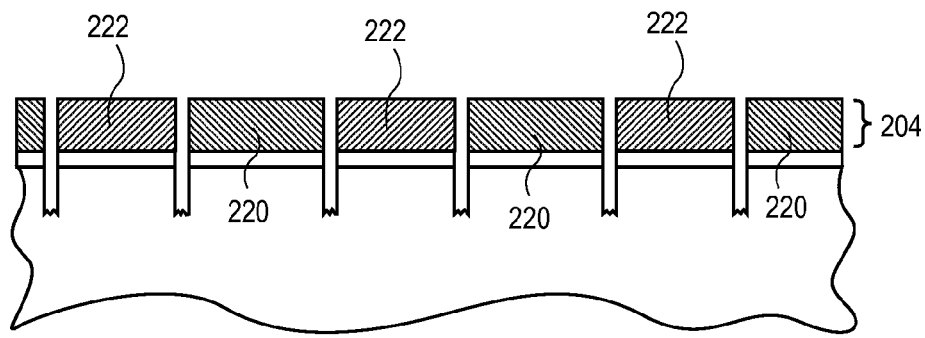
FIG. 2H illustrates a cross-sectional view of a stage in the fabrication of a back-contact solar cell, in accordance with an embodiment of the present invention.

In an embodiment, referring to FIG. 2H, heating the substrate 200 also includes activating the dopants from the first and second solid-state dopant sources 206 and 210, respectively, to form a plurality of polysilicon regions 220 of the second conductivity type and a plurality of polysilicon regions 222 of the first conductivity type. In one embodiment, the activating includes changing the incorporation of at least some of the dopants from interstitial to substitutional within polysilicon layer 204. In an embodiment, the first and second solid-state dopant sources 206 and 210 are also removed, as is also depicted in FIG. 2H. In one such embodiment, the first and second solid-state dopant sources 206 and 210 are removed by using a wet etch technique by applying a wet solution including aqueous hydrofluoric acid or another source of HF. In another such embodiment, the first and second solid-state dopant sources 206 and 210 are removed by plasma etching.

Figure 2I:
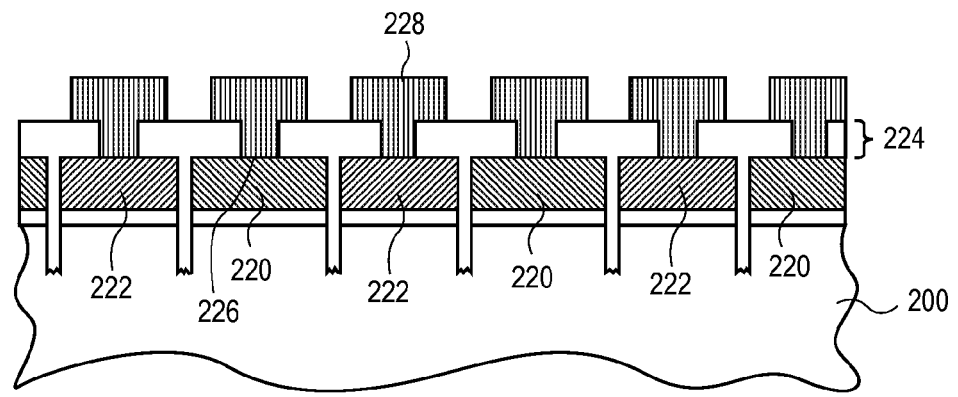
FIG. 2I illustrates a cross-sectional view of a stage in the fabrication of a back-contact solar cell, in accordance with an embodiment of the present invention.

Referring to FIG. 2I, in an embodiment, the method of forming emitters for the back-contact solar cell optionally further includes forming a dielectric layer 224 above the plurality of polysilicon regions 220 of the second conductivity type, above the plurality of polysilicon regions 222 of the first conductivity type, and above the exposed portions of substrate 200. In one embodiment, the dielectric layer 224 is an anti-reflective coating (ARC) layer.

Referring again to FIG. 2I, in an embodiment the method of forming emitters for the back-contact solar cell optionally further includes forming, by laser abalation, a plurality of contact openings 226 to the plurality of polysilicon regions 220 of the second conductivity type and to the plurality of polysilicon regions 222 of the first conductivity type. Conductive contacts 228 may then be formed in the plurality of contact openings 226 and coupled to the plurality of polysilicon regions 220 of the second conductivity type and to the plurality of polysilicon regions 222 of the first conductivity type. In an embodiment, the conductive contacts 228 are composed of metal and are formed by a deposition, lithographic, and etch approach.

Figure 3:
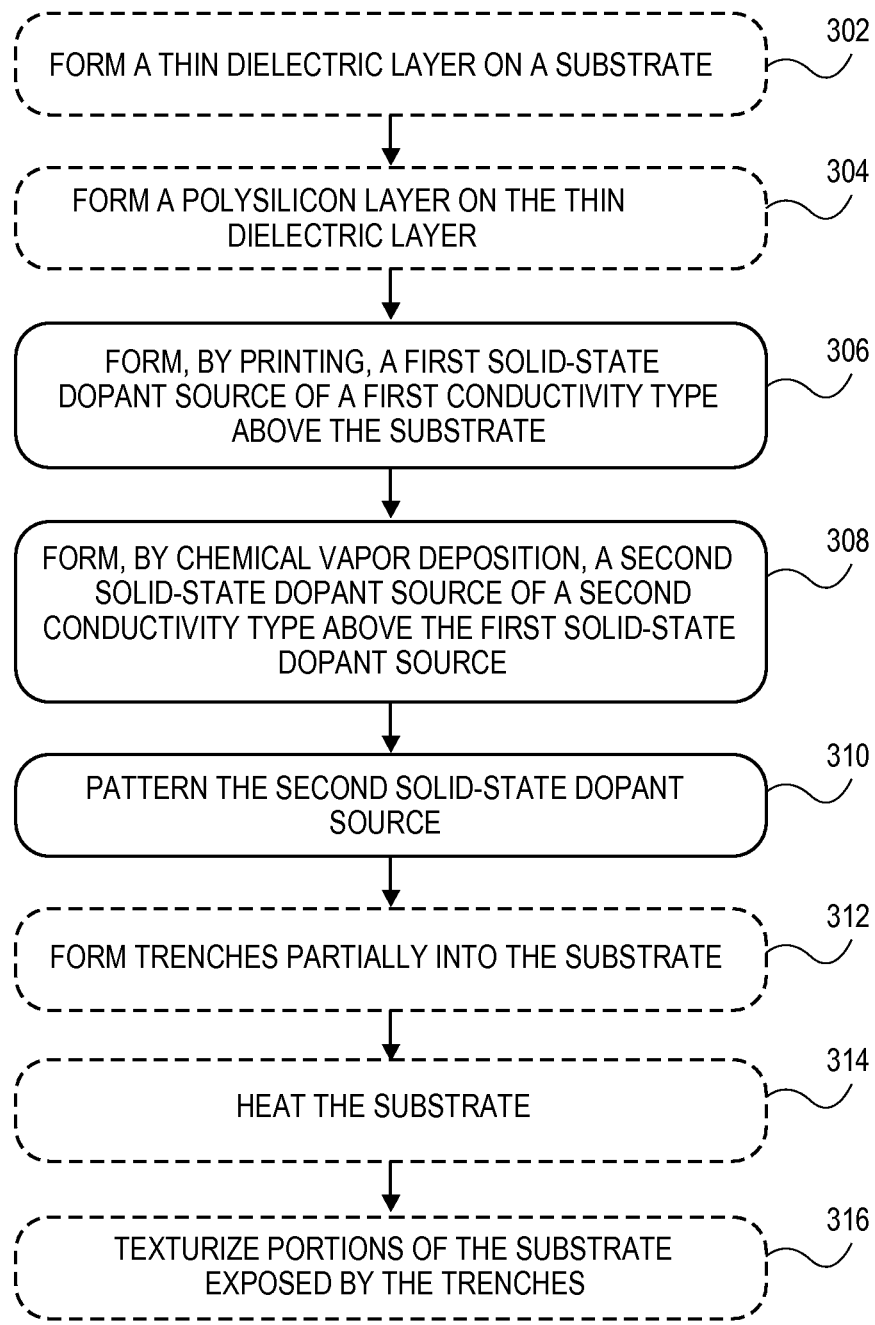
FIG. 3 illustrates a flowchart representing operations in another method of forming emitters for a back-contact solar cell, in accordance with an embodiment of the present invention.

In another aspect of the present invention, a second conductivity-type solid-state dopant source is formed by blanket deposition over features of a printed first conductivity-type solid-state dopant source. For example, FIG. 3 illustrates a flowchart 300 representing operations in a method of forming emitters for a back-contact solar cell, in accordance with another embodiment of the present invention. FIGS. 2A, 2B, and 4A-4E, 2I, and 2J illustrate cross-sectional views of various stages in the fabrication of a back-contact solar cell, corresponding to operations of flowchart 300, in accordance with an embodiment of the present invention.

Referring to operation 302 of flowchart 300, and to corresponding FIG. 2A, a method of forming emitters for a back-contact solar cell includes optionally forming a thin dielectric layer 202 on a substrate 200.

In an embodiment, the thin dielectric layer 202 is composed of silicon dioxide and has a thickness approximately in the range of 5-50 Angstroms. In one embodiment, the thin dielectric layer 202 performs as a tunneling oxide layer. In an embodiment, substrate 200 is a bulk single-crystal substrate, such as an n-type doped single crystalline silicon substrate. However, in an alternative embodiment, substrate 200 includes a polycrystalline silicon layer disposed on a global solar cell substrate.

Referring to operation 304 of flowchart 100, and to corresponding FIG. 3B, the method of forming emitters for the back-contact solar cell also includes optionally forming a polysilicon layer 204 on the thin dielectric layer 202. It is to be understood that use of the term polysilicon layer is intended to also cover material that can be described as amorphous- or α-silicon.

Figure 4A:
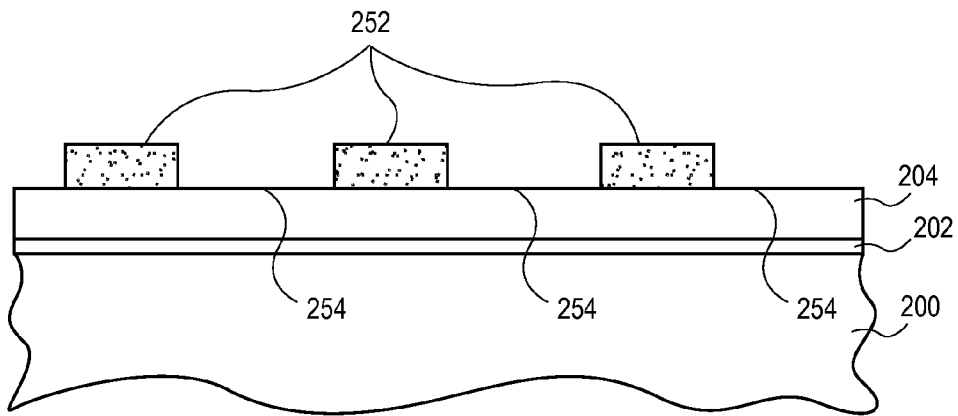
FIG. 4A illustrates a cross-sectional view of a stage in the fabrication of a back-contact solar cell, also corresponding to operation 306 of the flowchart of FIG. 3, in accordance with an embodiment of the present invention.

Referring to operation 306 of flowchart 300, and to corresponding FIG. 4A, the method of forming emitters for the back-contact solar cell includes forming, by printing, a first solid-state dopant source 252 of a first conductivity type above substrate 200. The first solid-state dopant source 252 includes a plurality of regions separated by gaps 254. In an embodiment, the printing is performed by a technique such as, but not limited to, ink-jet printing, screen printing, or aerosol printing.

In an embodiment, the gaps 254 expose regions of the polysilicon layer 204 between a plurality of regions of the first solid-state dopant source 252, as depicted in FIG. 4A. In an embodiment, the total coverage of the first solid-state dopant source 252 above the substrate 200 is in the range of 10-15% by surface area, e.g., approximately 12%.

In an embodiment, the first solid-state dopant source 252 is composed of a material such as, but not limited to, a spin-on-glass precursor material or a nanoparticle material. The spin-on-glass precursor material or the nanoparticle material includes dopants of the first conductivity type disposed therein. For example, in one embodiment, the first conductivity type is n-type and the dopant impurity atoms are phosphorus atoms. In one embodiment, the first conductivity type is p-type and the dopant impurity atoms are boron atoms.

Figure 4B:
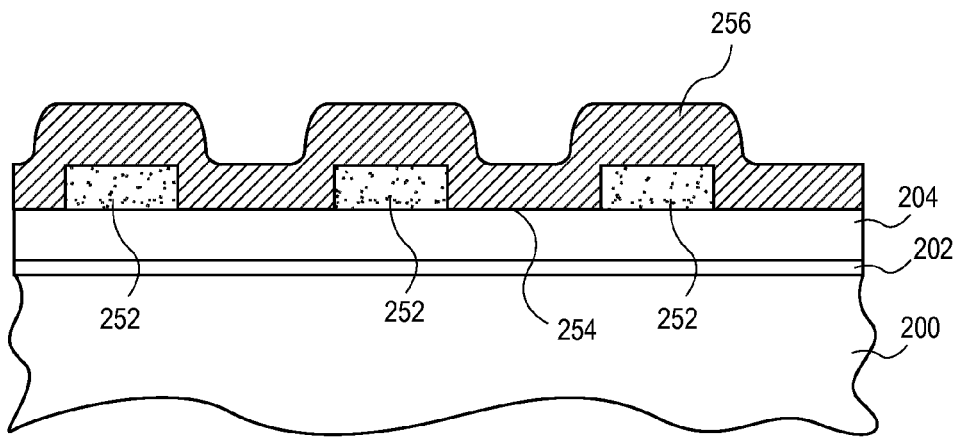
FIG. 4B illustrates a cross-sectional view of a stage in the fabrication of a back-contact solar cell, also corresponding to operation 308 of the flowchart of FIG. 3, in accordance with an embodiment of the present invention.

Referring to operation 308 of flowchart 300, and to corresponding FIG. 4B, the method of forming emitters for the back-contact solar cell also includes forming, by chemical vapor deposition, a second solid-state dopant source 256 of a second conductivity type above the first solid-state dopant source 252. The second solid-state dopant source 256 is also formed above the substrate 200, in the gaps 254 of the plurality of regions of the first solid-state dopant source 252.

In an embodiment, forming the second solid-state dopant source 256 includes forming a layer of BSG or a layer of PSG. In one such embodiment, the BSG or PSG layer is formed by chemical vapor deposition as a uniform, blanket layer. In an embodiment, the second conductivity type is opposite the first conductivity type. For example, in one embodiment, the first conductivity type is p-type, the second conductivity type is n-type, and the second solid-state dopant source 256 is composed of PSG. In another embodiment, the first conductivity type is n-type, the second conductivity type is p-type, and the second solid-state dopant source 256 is composed of BSG.

In an embodiment, the first solid-state dopant source 252 and portions of the second solid-state dopant source 256 are formed on the polysilicon layer 204. However, there may be applications where a polysilicon layer distinct from a substrate is not used. Thus, in another embodiment (not shown), the first solid-state dopant source 252 and the portions of the second solid-state dopant source 256 are formed directly on a substrate (such as directly on substrate 200) or on a thin oxide layer on the surface of the substrate.

Figure 4C:
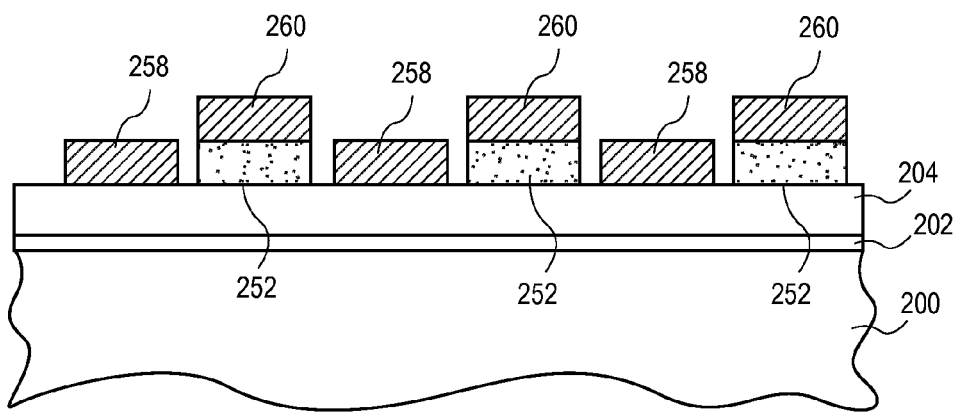
FIG. 4C illustrates a cross-sectional view of a stage in the fabrication of a back-contact solar cell, also corresponding to operation 310 of the flowchart of FIG. 3, in accordance with an embodiment of the present invention.

Referring to operation 310 of flowchart 300, and to corresponding FIG. 4C, the method of forming emitters for the back-contact solar cell also includes patterning the second solid-state dopant source 256 to form first regions 258 of the second solid-state dopant source 256 in the gaps 254 of the plurality of regions of the first solid-state dopant source 252 but not in contact with the plurality of regions of the first solid-state dopant source 252. Furthermore, second regions 260 of the second solid-state dopant source 256 are also formed on the plurality of regions of the first solid-state dopant source 252, as depicted in FIG. 4C.

In an embodiment, patterning the second solid-state dopant source 256 includes patterning a layer of BSG or a layer of PSG. In a specific embodiment, the BSG or PSG layer is formed by chemical vapor deposition as a uniform, blanket layer and then patterned by a lithography and etch process. In a particular such embodiment, the BSG or PSG layer is formed by a chemical vapor deposition technique such as, but not limited to, atmospheric pressure chemical vapor deposition (APCVD), plasma-enhanced chemical vapor deposition (PECVD), low-pressure chemical vapor deposition (LPCVD), or ultra-high vacuum chemical vapor deposition (UHVCVD). In an embodiment, the first regions 258 of the second solid-state dopant source 256 are formed in the gaps 254 of the plurality of regions of the first solid-state dopant source 252 but not in contact with the plurality of regions of the first solid-state dopant source 252, as depicted in FIG. 4C. And, in a more specific embodiment, the first regions 258 of the second solid-state dopant source 256 are spaced apart from the plurality of regions of the first solid-state dopant source 252, as is also depicted in FIG. 4C.

Figure 4D:
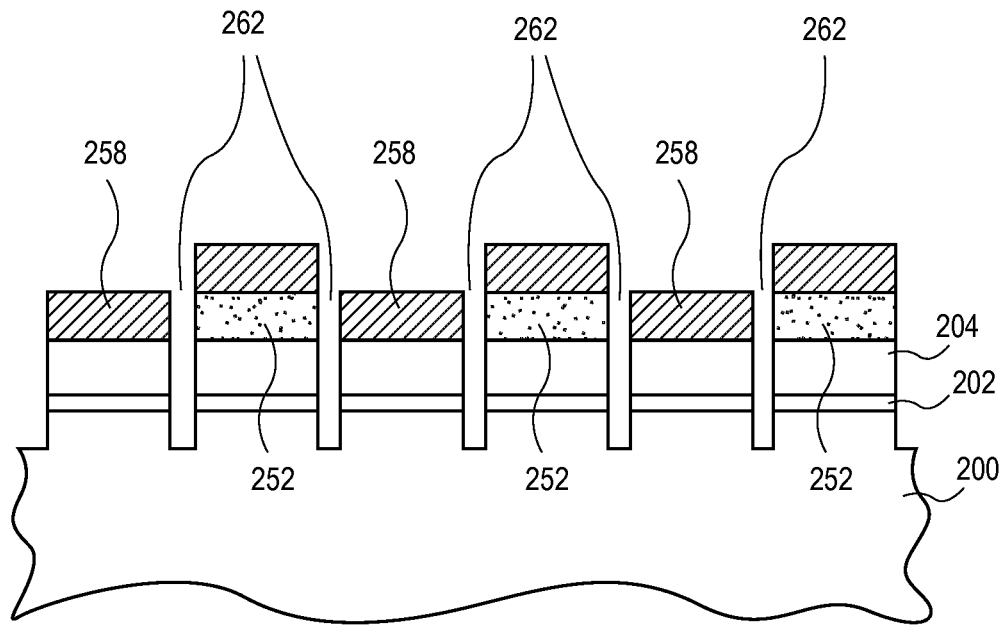
FIG. 4D illustrates a cross-sectional view of a stage in the fabrication of a back-contact solar cell, corresponding to operation 312 of the flowchart of FIG. 3, in accordance with an embodiment of the present invention.

Referring to operation 312 of flowchart 300, and to corresponding FIG. 4D, in one embodiment the method of forming emitters for the back-contact solar cell optionally further includes forming trenches 262 partially into the substrate 200, between the first regions 258 of the second solid-state dopant source 256 and the plurality of regions of the first solid-state dopant source 252. In an embodiment, the trenches 262 are formed in the polysilicon layer 204, in the thin dielectric layer 202, and partially in the substrate 200, as depicted in FIG. 4D.

Figure 4E:
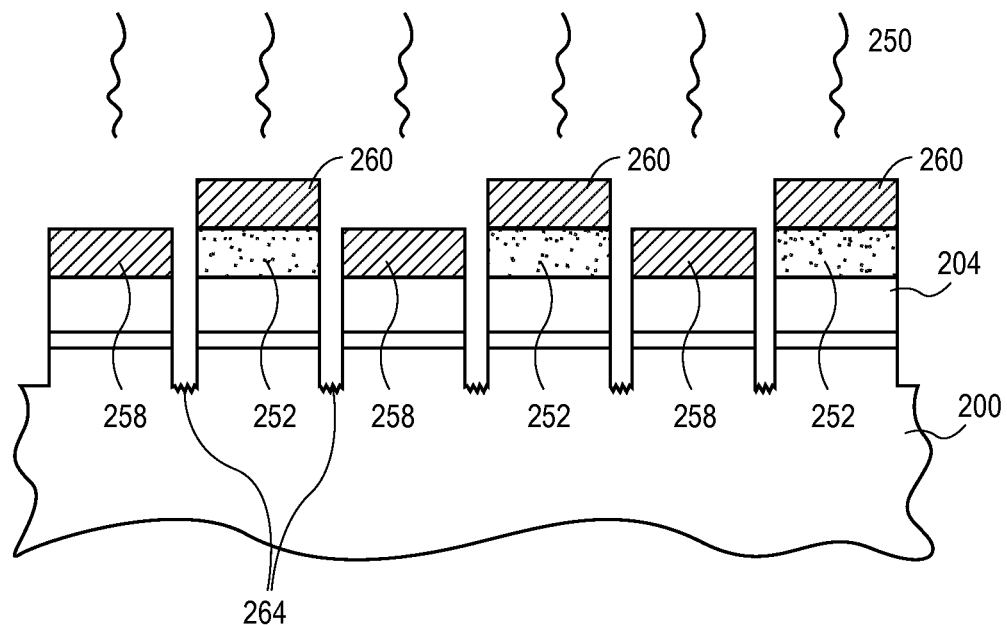
FIG. 4E illustrates a cross-sectional view of a stage in the fabrication of a back-contact solar cell, corresponding to operations 314 and 316 of the flowchart of FIG. 3, in accordance with an embodiment of the present invention.

Referring to operation 314 of flowchart 300, and to corresponding FIG. 4E, in one embodiment the method of forming emitters for the back-contact solar cell optionally further includes, subsequent to forming the trenches 262, heating 250 the substrate 200.

In an embodiment, the heating drives dopants from the first and second solid-state dopant sources 252 and 258. For example, in one embodiment, the first and second solid-state dopant sources 252 and 258 are formed on the polysilicon layer 204 and heating the substrate 200 drives dopants from the first and second solid-state dopant sources 252 and 258, respectively, into the polysilicon layer 204. However, in another embodiment, the first and second solid-state dopant sources 252 and 258 are formed directly on substrate 200 or on a thin oxide on substrate 200, and heating the substrate 200 drives dopants from the first and second solid-state dopant sources 252 and 258, respectively, into the substrate 200. In one specific such embodiment, the substrate 200 is a bulk crystalline silicon substrate, and the first solid-state dopant source 252 and the second solid-state dopant source 258 are formed on the bulk crystalline silicon substrate. The bulk crystalline silicon substrate is then heated to drive dopants from the first and second solid-state dopant sources 252 and 258 into the bulk crystalline silicon substrate.

In accordance with an embodiment of the present invention, the first solid-state dopant source 252 is sufficiently thick to block driving of dopants from the second regions 260 of the second solid-state dopant source 256 through the plurality of regions of the first solid-state dopant source 252. For example, while it may be desirable to drive dopants from the first regions 258 of the second solid-state dopant source 256 into an underlying polysilicon layer or substrate, it may not be desirable for dopants to be driven from the second regions 260 of the second solid-state dopant source 256 into the underlying polysilicon layer or substrate. Instead, in those regions, it may only be desirable to drive dopants from the first solid-state dopant source 252, underlying the second regions 260 of the second solid-state dopant source 256, into the underlying polysilicon layer or substrate. Beyond thickness, other parameters that may be considered for adequate blocking of the driving of dopants from the second regions 260 of the second solid-state dopant source 256 through the plurality of regions of the first solid-state dopant source 252 include, but need not be limited to, dopant concentration in the first solid-state dopant source 252, density of the first solid-state dopant source 252, identity of dopant species, and timing for the heating operation 314.

Referring to operation 316 of flowchart 300, and again to corresponding FIG. 4E, in one embodiment the method of forming emitters for the back-contact solar cell optionally further includes, texturizing portions 264 of the substrate 200 exposed by the trenches 262.

In an embodiment, the texturing provides a random texture pattern. The random texturing pattern may be formed by applying an anisotropic etching process to exposed regions of substrate 200 and may thus be determined by crystal planes, such single-crystalline silicon planes, of the substrate 200. In an embodiment, the heating of operation 314 hardens the first solid-state dopant source 252. Then, during the texturizing of the portions 264 of the substrate 200 exposed by the trenches 262, the hardened first solid-state dopant source acts as a mask.

In an embodiment, referring to FIG. 2H, heating the substrate 200 also includes activating the dopants from the first and second solid-state dopant sources 252 and 258, respectively, to form a plurality of polysilicon regions 220 of the first conductivity type and a plurality of polysilicon regions 222 of the second conductivity type. In one embodiment, the activating includes changing the incorporation of at least some of the dopants from interstitial to substitutional within polysilicon layer 204. In an embodiment, the first and second solid-state dopant sources 252 and 258 are also removed, as is also depicted in FIG. 2H. In one such embodiment, the first and second solid-state dopant sources 252 and 258 are removed by using a wet etch technique by applying a wet solution including aqueous hydrofluoric acid or another source of HF. In another such embodiment, the first and second solid-state dopant sources 252 and 258 are removed by plasma etching.

Referring to FIG. 2I, in an embodiment, the method of forming emitters for the back-contact solar cell optionally further includes forming a dielectric layer 224 above the plurality of polysilicon regions 220 of the first conductivity type, above the plurality of polysilicon regions 222 of the second conductivity type, and above the exposed portions of substrate 200. A plurality of contact openings 226 may then be formed, exposing the plurality of polysilicon regions 220 of the first conductivity type and to the plurality of polysilicon regions 222 of the second conductivity type. Conductive contacts 228 may then be formed in the plurality of contact openings 226 and coupled to the plurality of polysilicon regions 220 of the first conductivity type and to the plurality of polysilicon regions 222 of the second conductivity type.

It is to be understood that the operations of flowcharts 100 and 300 and the corresponding Figures are provided in the particular sequences for illustrative purposes. Other embodiments contemplated within the spirit and scope of the invention may include different fabrication sequences. For example, the specific ordering illustrated may be altered or varied, unless specified for particular embodiments. For example, the formation of trenches in the method described in association with flowchart 300 may, in other embodiments, not be necessary.

Thus, methods of forming emitters for back-contact solar cells have been disclosed. In accordance with an embodiment of the present invention, a method includes forming, by chemical vapor deposition, a first solid-state dopant source of a first conductivity type above a substrate, the first solid-state dopant source including a plurality of regions separated by gaps. The method also includes forming, by printing, regions of a second solid-state dopant source of a second conductivity type above the substrate, in the gaps of the plurality of regions of the first solid-state dopant source but not in contact with the plurality of regions of the first solid-state dopant source, wherein the first conductivity type is opposite the second conductivity type. In one embodiment, the second solid-state dopant source is composed of a spin-on-glass precursor material or a nanoparticle material. In one embodiment, the first conductivity type is p-type, the second conductivity type is n-type, and the first solid-state dopant source is composed of boron silicate glass (BSG). In one embodiment, the first conductivity type is n-type, the second conductivity type is p-type, and the first solid-state dopant source is composed of phosphorus silicate glass (PSG).

What is claimed is:
1. A method of forming emitters for a solar cell, the method comprising:
  printing a first solid-state dopant source of a first conductivity type above a substrate, the first solid-state dopant source comprising a plurality of spaced apart regions;
  depositing by chemical vapor deposition a second solid-state dopant source of a second conductivity type above and between the plurality of spaced apart regions of the first solid-state dopant source, wherein the first conductivity type is opposite the second conductivity type; and
  patterning the second solid-state dopant source to form a plurality of first regions of the second solid-state dopant source alternating with but not in contact with the plurality of spaced apart regions of the first solid-state dopant source, and to form a plurality of second regions of the second solid-state dopant source on the plurality of spaced apart regions of the first solid-state dopant source; and driving dopants from the plurality of first regions of the second solid-state dopant source and from the first solid-state dopant source, but not from the plurality of second regions of the second solid-state dopant source, into the substrate.

2. The method of claim 1, wherein the plurality of spaced apart regions of the first solid-state dopant source is a plurality of discontinuous regions of the first solid-state dopant source.

3. The method of claim 1, further comprising:
forming trenches partially into the substrate, between the plurality of first regions of the second solid-state dopant source and the plurality of spaced apart regions of the first solid-state dopant source.

4. The method of claim 3, wherein driving dopants comprises heating the substrate, wherein the heating hardens the first solid-state dopant source.

5. The method of claim 4, further comprising:
subsequent to the forming the trenches and to the heating, texturizing portions of the substrate exposed by the trenches, wherein the hardened first solid-state dopant source acts as a mask during the texturizing.

6. The method of claim 1, wherein printing the first solid-state dopant source comprises using a spin-on-glass precursor material or a nanoparticle material.

7. The method of claim 1, wherein the first conductivity type is n-type, the second conductivity type is p-type, and wherein depositing the second solid-state dopant source comprises depositing a boron silicate glass (BSG) material.

8. The method of claim 1, wherein the first conductivity type is p-type, the second conductivity type is n-type, and wherein depositing the second solid-state dopant source comprises depositing a phosphorus silicate glass (PSG) material.

9. A method of forming emitters for a solar cell, the method comprising:
printing a first solid-state dopant source of a first conductivity type above a semiconductor layer formed on a thin dielectric layer formed on a substrate, the first solid-state dopant source comprising a plurality of spaced apart regions;
depositing by chemical vapor deposition a second solid-state dopant source of a second conductivity type above and between the plurality of spaced apart regions of the first solid-state dopant source, wherein the first conductivity type is opposite the second conductivity type; and
patterning the second solid-state dopant source to form a plurality of first regions of the second solid-state dopant source alternating with but not in contact with the plurality of spaced apart regions of the first solid-state dopant source, and to form a plurality of second regions of the second solid-state dopant source on the plurality of spaced apart regions of the first solid-state dopant source; and
driving dopants from the plurality of first regions of the second solid-state dopant source and from the first solid-state dopant source, but not from the plurality of second regions of the second solid-state dopant source, into the semiconductor layer.

10. The method of claim 9, wherein the plurality of spaced apart regions of the first solid-state dopant source is a plurality of discontinuous regions of the first solid-state dopant source.

11. The method of claim 9, further comprising:
forming trenches into the semiconductor layer and partially into the substrate, between the plurality of first regions of the second solid-state dopant source and the plurality of spaced apart regions of the first solid-state dopant source.

12. The method of claim 11, wherein driving dopants comprises heating the substrate, wherein the heating hardens the first solid-state dopant source.

13. The method of claim 12, further comprising:
subsequent to the forming the trenches and to the heating, texturizing portions of the substrate exposed by the trenches, wherein the hardened first solid-state dopant source acts as a mask during the texturizing.

14. The method of claim 9, wherein printing the first solid-state dopant source comprises printing a spin-on-glass precursor material or a nanoparticle material.

15. The method of claim 9, wherein the first conductivity type is n-type, the second conductivity type is p-type, and wherein depositing the second solid-state dopant source comprises depositing a boron silicate glass (BSG) material.

16. The method of claim 9, wherein the first conductivity type is p-type, the second conductivity type is n-type, and wherein depositing the second solid-state dopant source comprises depositing a phosphorus silicate glass (PSG) material.

17. A method of forming emitters for a solar cell, the method comprising:
forming, by a first dopant forming process type, a first solid-state dopant source of a first conductivity type above a substrate, the first solid-state dopant source comprising a plurality of spaced apart regions; and
forming, by a second dopant forming process type, a first plurality of regions of a second solid-state dopant source of a second conductivity type above the substrate and alternating with, but not in contact with, the plurality of spaced apart regions of the first solid-state dopant source, wherein the first conductivity type is opposite the second conductivity type, and wherein the first dopant forming process type is different than the second dopant forming process type.

18. The method of claim 17, wherein the plurality of spaced apart regions of the first solid-state dopant source is a plurality of discontinuous regions of the first solid-state dopant source.

19. The method of claim 17, wherein forming the first solid-state dopant source by the first dopant forming process type comprises printing the first solid-state dopant source, and wherein forming the second solid-state dopant source by the second dopant forming process type comprises depositing the second solid-state dopant source by chemical vapor deposition.

20. The method of claim 17, wherein forming the first solid-state dopant source by the first dopant forming process type comprises depositing the first solid-state dopant source by chemical vapor deposition, and wherein forming the second solid-state dopant source by the second dopant forming process type comprises printing the second solid-state dopant source.

* * * * *